United States Patent
Ohnishi et al.

(10) Patent No.: US 6,800,532 B2
(45) Date of Patent: Oct. 5, 2004

(54) METHOD OF MANUFACTURING A SEMICONDUCTOR DEVICE COMPRISING A BIPOLAR TRANSISTOR AND A VARIABLE CAPACITOR

(75) Inventors: Teruhito Ohnishi, Osaka (JP); Takeshi Takagi, Kyoto (JP); Akira Asai, Osaka (JP); Taizo Fujii, Kyoto (JP); Mitsuo Sugiura, Shiga (JP); Yoshihisa Minami, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/620,613

(22) Filed: Jul. 17, 2003

(65) Prior Publication Data

US 2004/0018692 A1 Jan. 29, 2004

Related U.S. Application Data

(62) Division of application No. 10/061,365, filed on Feb. 4, 2002, now Pat. No. 6,642,607.

(30) Foreign Application Priority Data

Feb. 5, 2001 (JP) ........................................ 2001-027914

(51) Int. Cl.[7] .......................................... H01L 21/8222
(52) U.S. Cl. ...................................... 438/314; 438/329
(58) Field of Search ................................ 438/309, 312, 438/314, 326, 329, 343, 379, 381; 257/E21.017, E27.019, E27.03, E27.037

(56) References Cited

U.S. PATENT DOCUMENTS

| 4,814,284 | A | | 3/1989 | Inoue et al. |
| 5,021,852 | A | * | 6/1991 | Sukegawa et al. .......... 257/378 |
| 5,093,694 | A | | 3/1992 | Ueyama |
| 5,886,374 | A | * | 3/1999 | Sakamoto et al. .......... 257/292 |
| 6,100,770 | A | | 8/2000 | Litwin et al. |
| 6,461,925 | B1 | * | 10/2002 | John et al. ................... 438/309 |
| 6,551,890 | B2 | * | 4/2003 | Dekker et al. .............. 438/329 |
| 6,670,228 | B2 | * | 12/2003 | Coolbaugh et al. ......... 438/202 |
| 2002/0096725 | A1 | * | 7/2002 | Yoshihisa ................... 257/369 |

FOREIGN PATENT DOCUMENTS

WO 97/23900 7/1997

* cited by examiner

*Primary Examiner*—George Fourson
*Assistant Examiner*—Brook Kebede
(74) *Attorney, Agent, or Firm*—McDermott Will & Emery LLP

(57) ABSTRACT

A variable capacitor includes an N+ layer including a variable capacitance region, a P+ layer epitaxially grown on the N+ layer and formed from a SiGe film and a Si film, and a P-type electrode. An NPN-HBT (Hetero-junction Bipolar Transistor) includes a collector diffusion layer formed simultaneously with the N+ layer of the variable capacitor, a collector layer, and a Si/SiGe layer epitaxially grown simultaneously with the P+ layer of the variable capacitor. Since a depletion layer formed in a PN junction of the variable capacitor can extend entirely across the N+ layer, reduction in variation range of the capacitance can be suppressed.

5 Claims, 10 Drawing Sheets

FIG. 4A
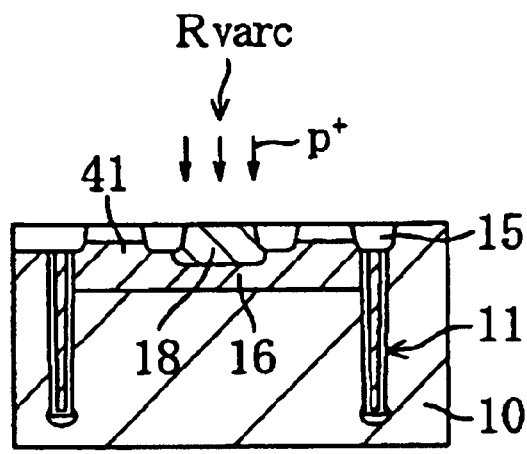
FIG. 4B
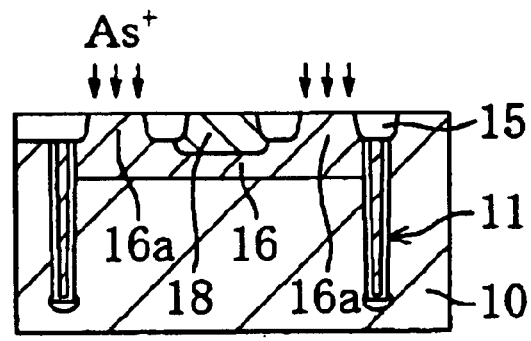
FIG. 4C
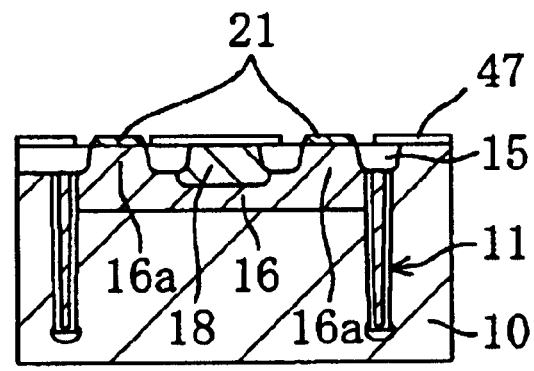
FIG. 4D
FIG. 4E
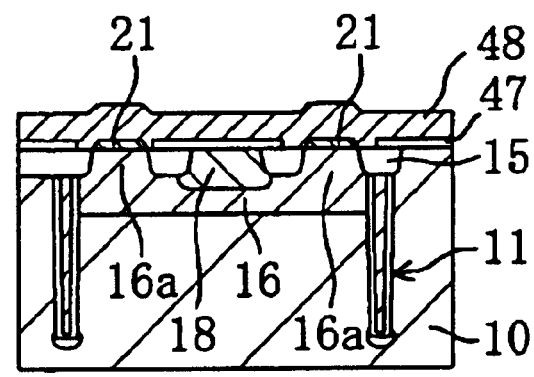

FIG. 6
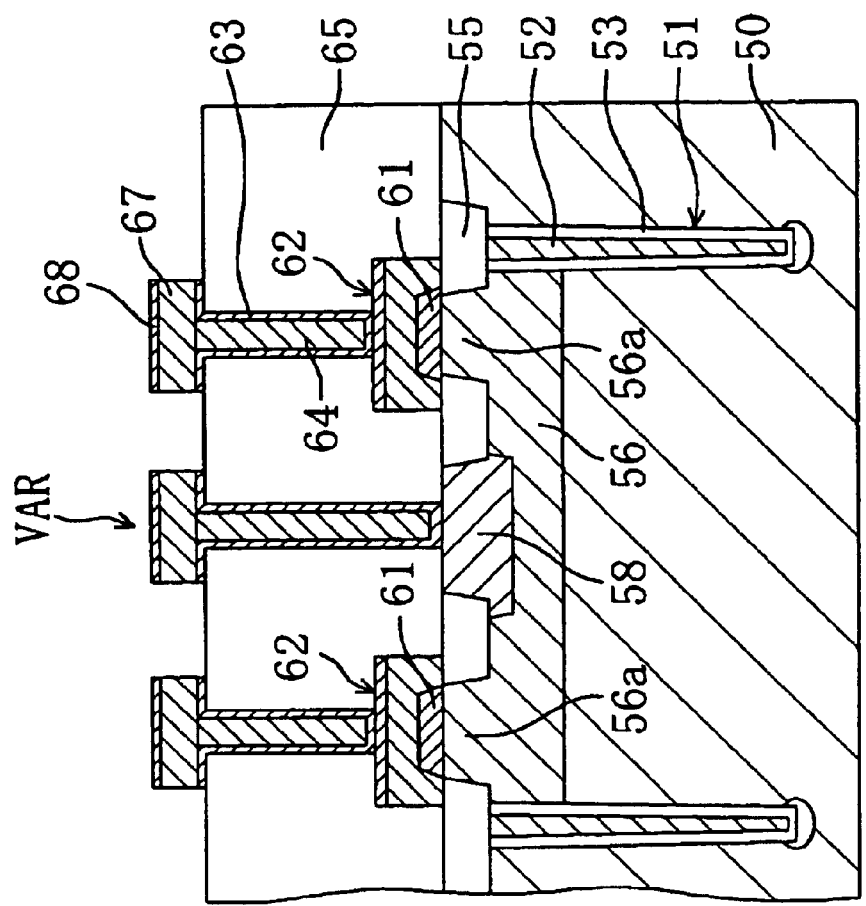
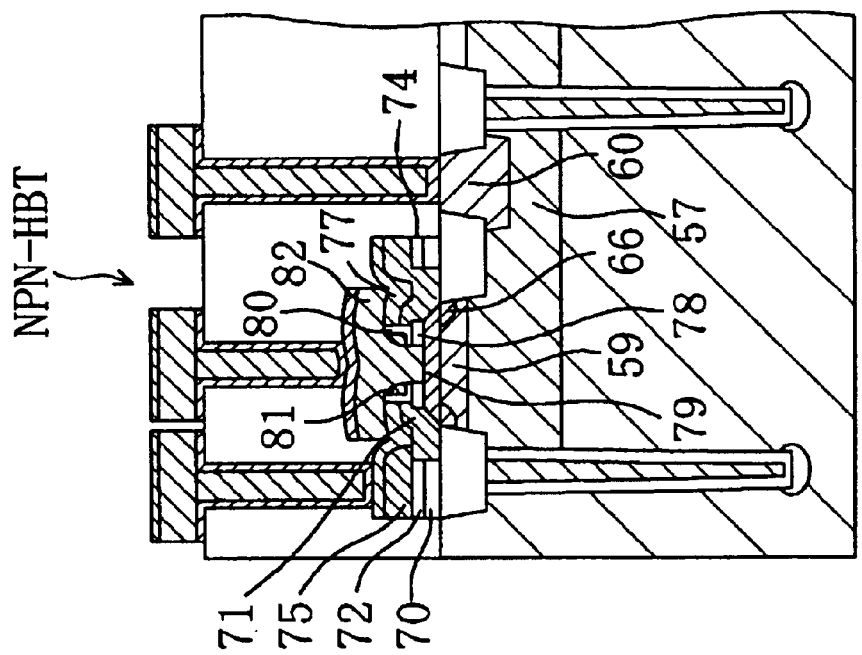

METHOD OF MANUFACTURING A SEMICONDUCTOR DEVICE COMPRISING A BIPOLAR TRANSISTOR AND A VARIABLE CAPACITOR

RELATED APPLICATION

This application is a divisional application of U.S. patent application Ser. No. 10/061,365, filed Feb. 4, 2002 now U.S. Pat. No. 6,642,607.

BACKGROUND OF THE INVENTION

The present invention generally relates to a semiconductor device including a variable capacitor using a PN junction. More particularly, the present invention relates to a method for increasing a variation range of a capacitance.

Conventionally, a variable capacitor is used as, e.g., a circuit element for switching a frequency in an oscillation circuit. One of high-performance variable capacitors is a capacitor using a junction capacitance of a PN junction diode.

For example, Japanese Laid-Open Publication No. 10-74961 discloses a semiconductor device having a PN junction formed by sequential implantation of N-type and P-type impurities. In this semiconductor device, the PN junction serves as a capacitance portion of a variable capacitor.

FIG. 9 is a schematic block diagram of the structure of a conventional device including an oscillation circuit mounted on a semiconductor substrate, an external variable capacitor and the like. As shown in FIG. 9, in the conventional device, the oscillation circuit (which includes a bipolar transistor BT) is provided on a semiconductor substrate 100 within a package. A variable capacitor VAR such as a variable capacitance diode and a resonance inductor Ind are provided on a motherboard (not shown) on which the semiconductor substrate 100 is mounted.

When an oscillator capable of varying a frequency is used, active elements are arranged within the oscillation circuit and the variable capacitor VAR (such as a variable capacitance diode) required to implement a resonant state is arranged outside the package in order to reduce the phase noise and obtain the frequency-varying capability. The variable capacitor VAR and the oscillation circuit in the package are connected to each other through a PAD, package leads and the like. The oscillation circuit, the resonance inductor Ind and the variable capacitor VAR form a resonance circuit.

In a device that includes a resonance circuit including both an oscillation circuit and a variable capacitor for varying the frequency of the oscillation circuit, high-performance passive elements such as a variable capacitor are commonly arranged outside the package having a semiconductor integrated circuit mounted therein. This is in order to obtain the capability to vary the frequency in a wide range and to reduce the noise.

In general, a variable capacitor having a greater change rate of the capacitance has greater capability. The capacitance is commonly changed by the change of the range of the depletion layer formed in the PN junction of the semiconductor layer. In other words, the variable capacitor using the PN junction has a larger capacitance when the depletion layer is smaller, and has a smaller capacitance when the depletion layer is larger. Accordingly, a sufficient depth or width is required for the depletion layer.

However, the conventional device of FIG. 9 has the following disadvantages because the variable capacitor such as a variable capacitance diode is provided outside the package.

The resonance circuit includes a large amount of parasitic capacitance Cpara of a PAD, leads and wires. The overall capacitance of the resonance circuit is equal to the sum of the capacitance of the variable capacitor and the parasitic capacitance Cpara. Since the parasitic capacitance Cpara has a fixed value, the variation range of the oscillation frequency of the resonance circuit is reduced. In order to use a high oscillation frequency, e.g., a high frequency signal of 1 GHz or more, at least one of the inductance of the resonance inductor Ind and the capacitance of the variable capacitor VAR must be reduced. However, even if the capacitance of the variable capacitor is reduced, it is difficult to reduce the overall capacitance of the resonance circuit due to the large parasitic capacitance Cpara. Accordingly, it is becoming increasingly hard to deal with the recent rapid increase in frequency (several gigahertz or higher) of the electronic devices such as portable equipments.

It is therefore preferable to form at least an oscillation circuit and a resonant capacitance portion on a common semiconductor substrate and incorporate the semiconductor substrate into a package. Since a bipolar transistor is mostly used in the oscillation circuit (oscillation element), it is preferable to form a bipolar transistor and a variable capacitor on a common semiconductor substrate. In this case, a collector layer of the bipolar transistor and a variable capacitance diode including a PN junction would be formed substantially in a common semiconductor layer.

However, in response to the recent increase in frequency, the collector layer of the bipolar transistor used in the oscillation circuit is increasingly becoming thinner. Accordingly, even in a capacitor that includes a P-type layer and an N-type layer in a semiconductor layer formed simultaneously with the collector layer, it is difficult from the standpoint of the manufacturing process to ensure a sufficient depth or width for the depletion layer formed in the PN junction. In other words, it is difficult to reduce the overall capacitance of the resonance circuit.

SUMMARY OF THE INVENTION

It is an object of the present invention to provide a semiconductor device including a variable capacitor having a large variation range of a capacitance and a manufacturing method thereof.

According to one aspect of the present invention, a semiconductor device includes a variable capacitor. The variable capacitor includes a first semiconductor layer of a first conductivity type, and a second semiconductor layer epitaxially grown on the first semiconductor layer. A PN junction region serving as a variable capacitance is formed at a boundary between the first semiconductor layer and the second semiconductor layer.

In this structure, a depletion layer formed at the PN junction extends in a variable range according to application of a voltage. Therefore, a variable capacitor having the depletion layer as a capacitance portion is obtained. The depletion layer can extend entirely across the depth of the first semiconductor layer. Therefore, the range of the depletion layer is increased as compared to the case where a P-type layer and an N-type layer are formed in the first semiconductor layer. In other words, the variation range of the capacitance can be increased even with a shallow collector region, making it possible to deal with a higher frequency. Moreover, improvement in capability of the variable capacitor (i.e., increase in concentration of the PN junction) enables reduction in the number of variable capacitors required for a certain device. In other words, the number of variable capacitors to be formed on a single semiconductor substrate can be reduced. This enables improvement in integration of the semiconductor device.

Preferably, the above semiconductor device further includes a bipolar transistor. The bipolar transistor has a third semiconductor layer, and a fourth semiconductor layer epitaxially grown on the third semiconductor layer. The fourth semiconductor layer has a base layer epitaxially grown simultaneously with the second semiconductor layer. This enables the variable capacitor and the bipolar transistor having excellent high-frequency characteristics to be formed on the same semiconductor substrate.

Preferably, the first semiconductor layer is a Si layer, and the second semiconductor layer is a $Si_{1-x-y}Ge_xC_y$ layer ($0<x<1$, $0<y<1$). As a result, excellent characteristics can be obtained using a hetero junction.

Preferably, the above semiconductor device further includes an oscillation circuit, and the variable capacitor is connected to the oscillation circuit. As a result, a resonance circuit capable of adjusting a frequency in an excellent manner can be obtained.

According to another aspect of the present invention, a method for manufacturing a semiconductor device including a variable capacitor and a bipolar transistor on a common semiconductor substrate includes the steps of: (a) forming a first semiconductor layer of a first conductivity type in a region of the semiconductor substrate where the variable capacitor is to be formed, and forming a second semiconductor layer of the first conductivity type in a region of the semiconductor substrate where the bipolar transistor is to be formed; and (b) after the step (a), forming a third semiconductor layer on the first semiconductor layer of the semiconductor substrate and forming a fourth semiconductor layer on the second semiconductor layer both by an epitaxial growth method.

The above method enables a semiconductor device including a variable capacitor and a bipolar transistor on the same semiconductor substrate to be formed by a reduced number of steps.

Preferably, a collector diffusion layer of the bipolar transistor is formed in the step (a), and a base layer of the bipolar transistor is formed in the step (b).

Preferably, the third and fourth semiconductor layers each including a $Si_{1-x-y}Ge_xC_y$ layer ($0<x<1$, $0<y<1$) are formed in the step (b). This enables formation of a semiconductor device including a bipolar transistor having excellent frequency characteristics and a variable capacitor having a large variation range of capacitance.

BRIEF DESCRIPTION OF THE DRAWINGS

FIGS. 4A to 4E are cross-sectional views illustrating the latter half of the manufacturing process of the semiconductor device including the variable capacitor according to the first embodiment;

FIG. 6 is a cross-sectional view of a semiconductor device including a variable capacitor and an NPN-HBT (Heterojunction Bipolar Transistor) on a common semiconductor substrate according to a second embodiment of the present invention;

FIG. 9 is a schematic block diagram of the structure of a conventional device including an oscillation circuit formed on a semiconductor substrate, an external variable capacitor and the like.

DESCRIPTION OF THE PREFERRED EMBODIMENTS

Hereinafter, a semiconductor device including a variable capacitor and a manufacturing method thereof according to the present invention will be described in conjunction with the accompanying drawings.

(First Embodiment)

Figure 1:
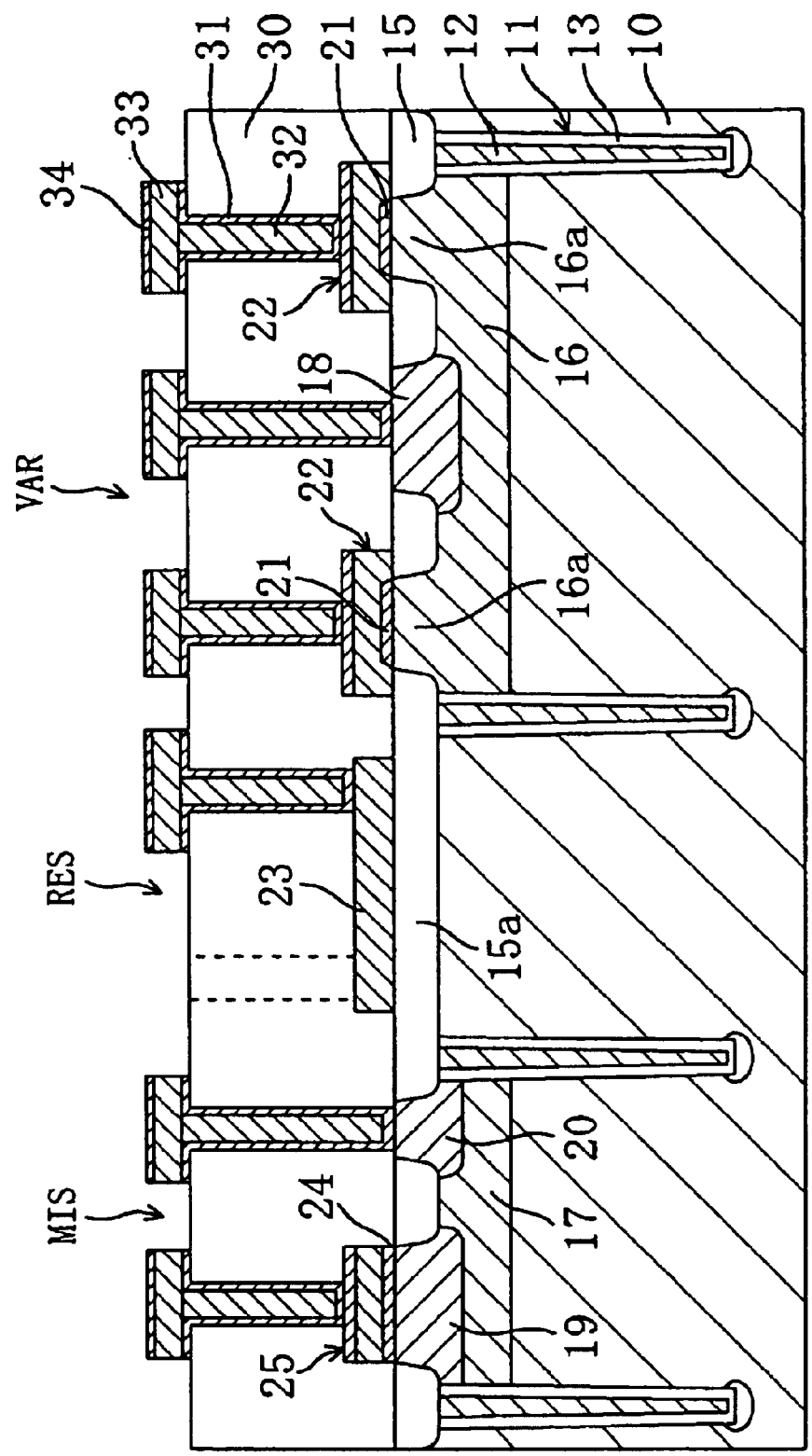
FIG. 1 is a cross-sectional view of a semiconductor device including a variable capacitor, a MIS (Metal Insulator Semiconductor) capacitor and a resistor on a common semiconductor substrate according to a first embodiment of the present invention.

FIG. 1 is a cross-sectional view of a semiconductor device including a variable capacitor (variable capacitance diode), a MIS (Metal Insulator Semiconductor) capacitor and a resistor on a common semiconductor substrate according to the first embodiment of the present invention. As shown in FIG. 1, a variable capacitance diode VAR, a resistor RES and a MIS capacitor MIS are formed on a silicon substrate 10.

A first isolation region 11 and a second isolation region 15 are formed in the silicon substrate 10. The first isolation region 11 is formed by depositing a thin silicon oxide film 13 in a deep trench and then introducing polysilicon 12 into the resultant trench. The second isolation region 15 is formed by introducing a silicon oxide film 13 into a shallow trench. The first isolation region 11 and the second isolation region 15 isolate the variable capacitor VAR, the resistor RES and the MIS capacitor MIS from each other. The second isolation region 15 defines an active region in each element.

The variable capacitor VAR includes an $N^+$ layer 16, an extended layer 18, a $P^+$ layer 21, and a P-type electrode 22. The $N^+$ layer 16 is formed by doping the silicon substrate 10 with arsenic (As). The extended layer 18 is formed by doping a surface portion of the $N^+$ layer 16 with high concentration As. The $P^+$ layer 21 is epitaxially grown on the $N^+$ layer 16, and is formed from a SiGe film partially containing boron (B) and a Si film. The $P^+$ layer 21 has a thickness of 110 nm. The P-type electrode 22 is formed from a $P^+$ polysilicon film covering the $P^+$ layer 21 and a titanium silicide layer formed thereon. The $P^+$ layer 21 is formed from an undoped $Si_{0.85}Ge_{0.15}$ film with a thickness of 40 nm, a boron-doped $Si_{0.85}Ge_{0.15}$ film with a thickness of 40 nm, and an undoped Si film with a thickness of 30 nm. The impurity concentration profile in a variable capacitance region 16a, i.e., a region of the N⁺ layer 16 that is located near the P⁺ layer 21, is such that the impurity concentration is $1 \times 10^{18}$ cm⁻³ at the surface and is gradually reduced toward the inside of the substrate. The second isolation region 15 isolates the variable capacitance region 16a and the extended layer 18 from each other.

Figure 10:
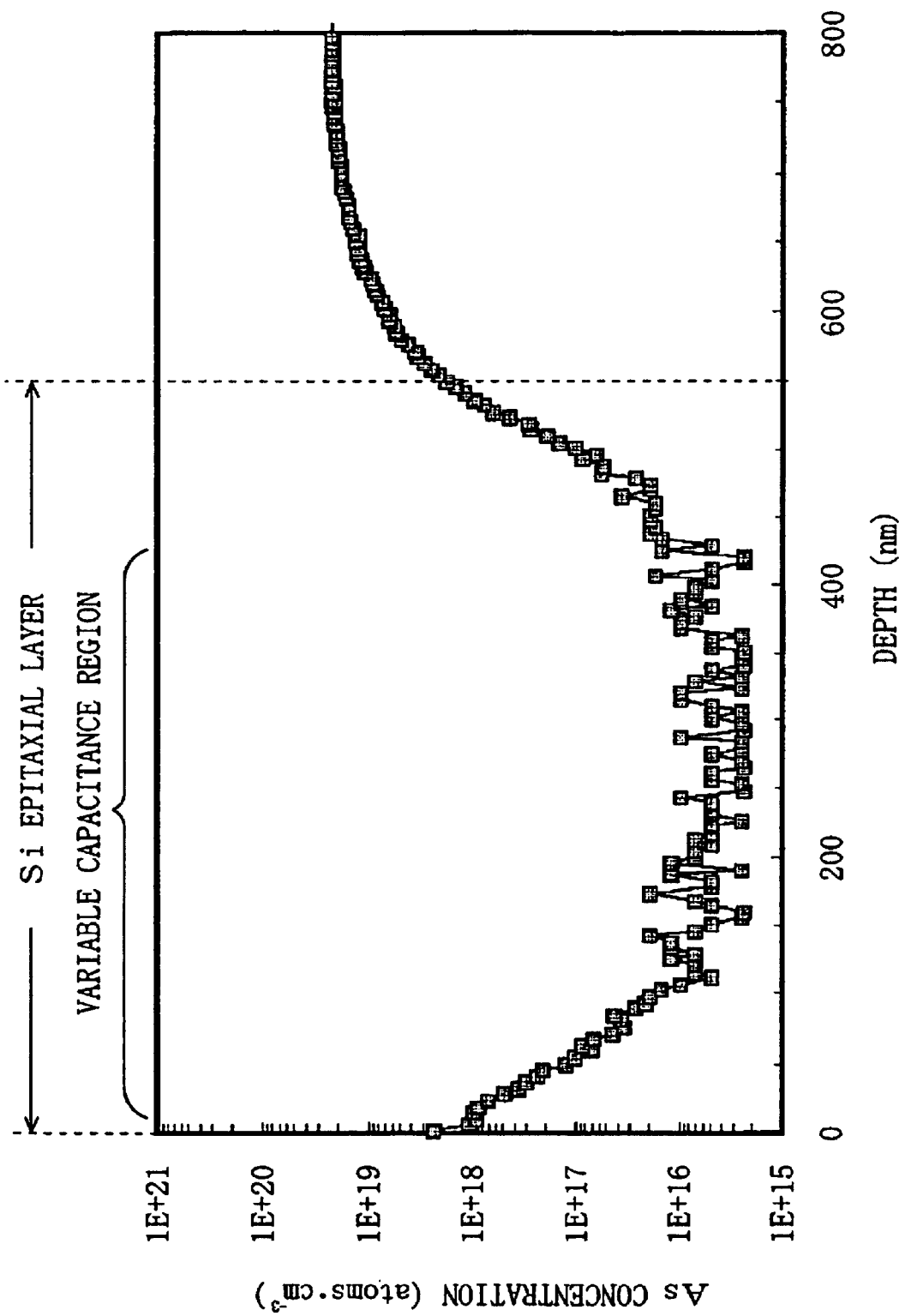
FIG. 10 shows a concentration profile in an $N^+$ layer of the variable capacitor of the first embodiment as measured by SIMS (Secondary Ion Mass Spectrometry).

FIG. 10 shows a concentration profile in the N⁺ layer 16 of the variable capacitor of the present embodiment as measured by the SIMS. In FIG. 10, the abscissa indicates the depth from the top surface of the silicon substrate. As shown in FIG. 10, the impurity concentration in the N⁺ layer 16 of the variable capacitor of the present embodiment has the maximum value at its surface and is gradually reduced toward the inside of the silicon substrate.

The resistor RES includes a resistive film 23 formed from a P⁺ polysilicon film. The resistive film 23 is formed on a silicon oxide film 15a embedded in a wide, shallow trench.

The MIS capacitor MIS includes an N⁺ layer 17, an N⁺⁺ layer 19 serving as a lower electrode, an extended layer 20, a capacitance insulating film 24, and an upper electrode 25. The N⁺ layer 17 is formed by doping the silicon substrate 10 with arsenic (As). The N⁺⁺ layer 19 is formed by doping the surface portion of the N⁺ layer 17 with high concentration As. The extended layer 20 is formed by doping the surface portion of the N⁺ layer 17 with high concentration phosphorus (P). The capacitance insulating film 24 is formed on the N⁺⁺ layer 19 and is formed from a thermal oxide film. The upper electrode 25 is formed from a P⁺ polysilicon film formed on the capacitance insulating film 24 and a titanium silicide film formed thereon. The second isolation region 15 isolates the N⁺⁺ layer 19 and the extended layer 20 from each other.

An interlayer insulating film 30 covers the substrate. A barrier film 31 and a tungsten plug 32 that extend through the interlayer insulating film 30 are connected to a portion 22, 18, 23, 20, 25. A wiring is formed form an aluminum (Al) alloy film 33 and an anti-reflection film 34 formed thereon. Note that the barrier film 31 extends also between the interlayer insulating film 30 and the Al alloy film 33.

The present embodiment is characterized in that the PN junction serving as a capacitance portion of the variable capacitor VAR is not formed within the silicon substrate 10 but across the P⁺ layer 21 formed from an epitaxially grown SiGe film and the N⁺ layer 16 and the variable capacitance region 16a that are formed within the silicon substrate 10.

Figure 2A:
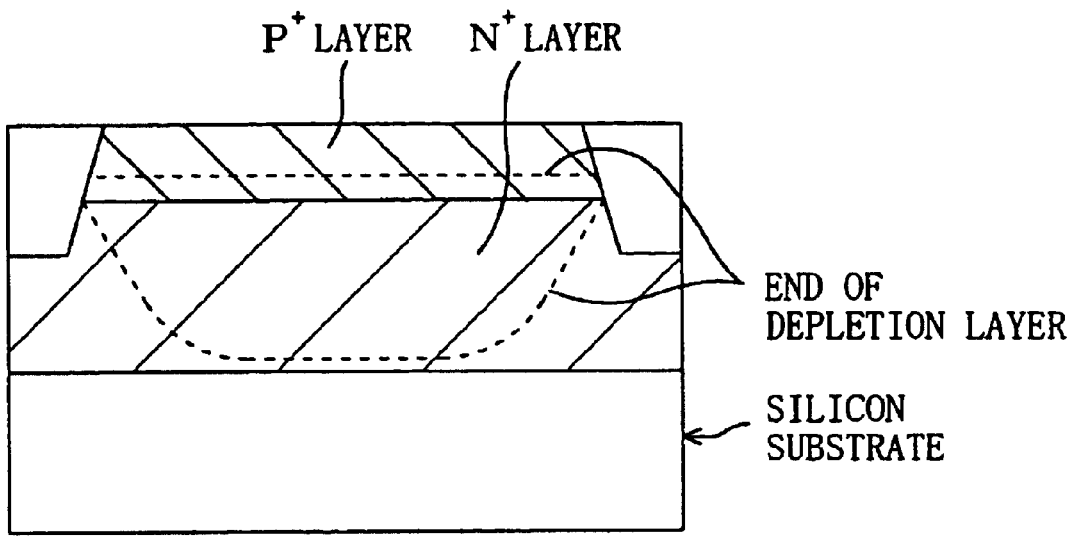
FIGS. 2A and 2B are schematic cross-sectional views of the structure of a main part of a conventional variable capacitor and the variable capacitor of the first embodiment, respectively.
Figure 2B:
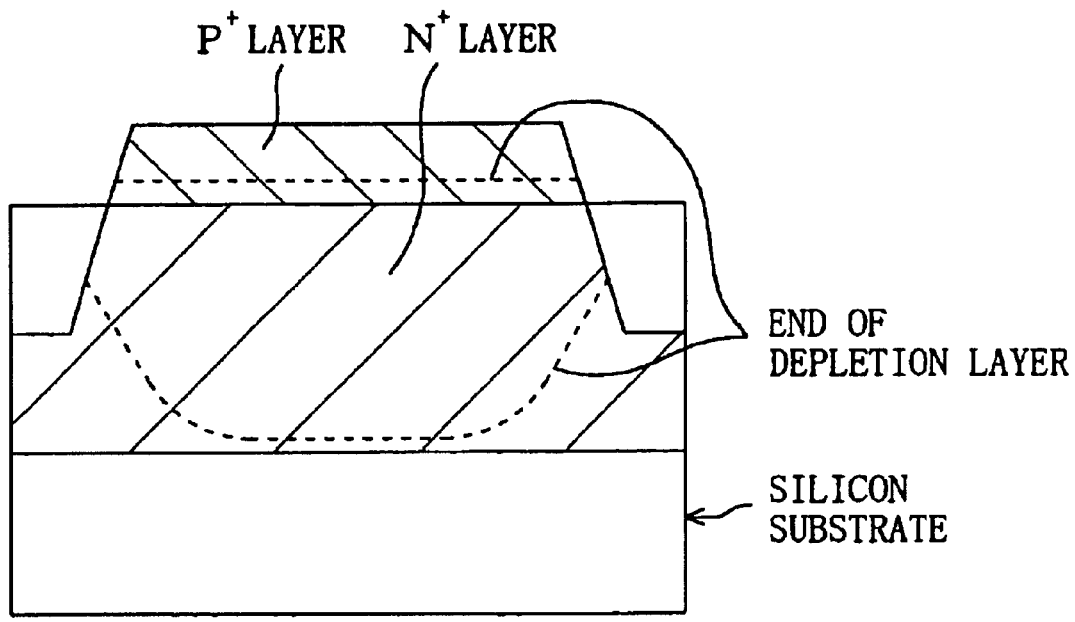

FIGS. 2A and 2B are schematic cross-sectional views of the structure of a main part of a conventional variable capacitor and the variable capacitor of the present embodiment, respectively. As shown in FIG. 2A, in the conventional variable capacitor, a P⁺ layer and an N⁺ layer are formed within the silicon substrate, and the PN junction is present within the silicon substrate. The depletion layer (see dashed line in the figure) extends from a prescribed depth within the silicon substrate to the lower end of the N⁺ layer. Therefore, as the N⁺ layer becomes thinner, the depletion layer can extend within a smaller region, and therefore the capacitance of the variable capacitor has a smaller variation range. As shown in FIG. 2B, however, in the variable capacitor of the present embodiment, the depletion layer extends in a greater region, i.e., from a position near the surface of the silicon substrate to the lower end of the N⁺ layer. Therefore, in the variable capacitor of the present embodiment, the depletion layer can extend across the whole depth of the N⁺ layer. As a result, the capacitance of the variable capacitor of the present embodiment has a greater variation range than that of the case where the PN junction is present within the silicon substrate. In particular, the capacitance of the variable capacitor has a greater variation range as the range of the depletion layer is increased, making it possible to deal with a higher frequency.

Moreover, improvement in capability of the variable capacitor enables reduction in the number of variable capacitors required for a certain device. In other words, the number of variable capacitors to be formed on a single semiconductor substrate can be reduced. This enables improvement in integration of the semiconductor device.

Hereinafter, a method for manufacturing a semiconductor device according to the present embodiment will be described. FIGS. 3A to 3F and FIGS. 4A to 4E are cross-sectional views illustrating a manufacturing process of the semiconductor device including a variable capacitor according to the present embodiment.

Figure 3A:
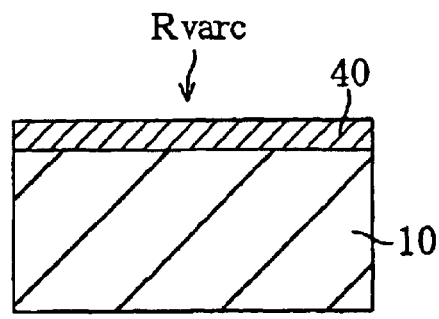
FIGS. 3A to 3F are cross-sectional views illustrating the first half of a manufacturing process of the semiconductor device including the variable capacitor according to the first embodiment.

First, in the step of FIG. 3A, the surface portion of the silicon substrate 10 is oxidized to form a silicon oxide film 40 with a thickness of about 500 nm.

Figure 3B:
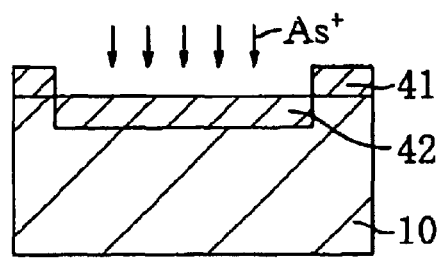

In the step of FIG. 3B, the silicon oxide film 40 is then patterned by a photolithography process and a wet etching process to form an implantation mask 41 that exposes a region Rvarc where a variable capacitor is to be formed (hereinafter, this region will be referred to as variable capacitor formation region Rvarc). A resist film is then removed, and arsenic ions (As⁺) are implanted into the silicon substrate 10 by using the implantation mask 41. This implantation is conducted at an implantation energy of 30 keV and a dose of $1.5 \times 10^{15}$ cm⁻². The resultant substrate is then successively oxidized and annealed at 1,000° C. so as to activate and diffuse As. An embedded N⁺ layer 42 is thus formed.

Figure 3C:
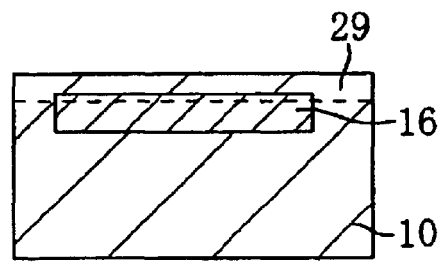

In the step of FIG. 3C, the implantation mask 41 and the thermal oxide film that was formed before the annealing process are removed by a wet etching process. Thereafter, a Si epitaxial layer 29 having a thickness of about 0.55 μm is epitaxially grown on the top surface of the silicon substrate 10. During the epitaxial growth, the impurities in the embedded N⁺ layer 42 diffuse into the Si epitaxial layer 29 to form an N⁺ layer 16 in the variable capacitor formation region Rvarc.

Figure 3D:
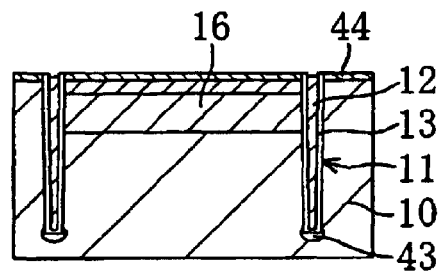

In the step of FIG. 3D, a mask film 44 is formed. The mask film 44 is formed from an oxide film with a thickness of about 10 nm and a nitride film with a thickness of about 200 nm. The mask film 44 is then patterned to form a first mask (not shown) that exposes a region where a first isolation region is to be formed. A dry etching process is then conducted by using the first mask to form a trench having a depth of about 3 μm in the silicon substrate 10. Boron (B) is then implanted into the region of the silicon substrate 10 that is located at the bottom of the trench, whereby a high concentration layer 43 is formed. The high concentration layer 43 serves to prevent formation of an inversion layer. Thereafter, the wall of the trench is oxidized to form a silicon oxide film 13. Polysilicon is then introduced into the trench to form a first isolation region 11.

Figure 3E:
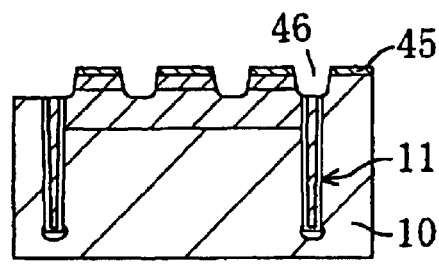

In the step of FIG. 3E, the first mask is further patterned to form a second mask 45 that exposes a region where a second isolation region is to be formed. A shallow trench 46 having a depth of about 400 nm is then formed in the silicon substrate 10 by using the second mask 45.

Figure 3F:
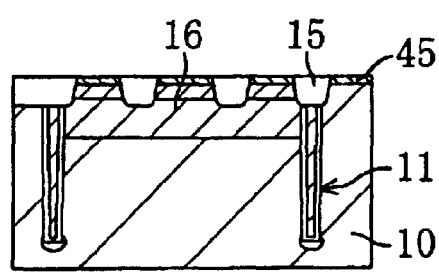

In the step of FIG. 3F, a silicon oxide film is deposited and a CMP (Chemical Mechanical Polishing) process is conducted. The silicon oxide film is thus embedded in the shallow trench 46 to form a second isolation region 15.

In the step of FIG. 4A, the second mask 45 is removed, and a resist film (not shown) is formed by a photolithography process so as to expose a region where an extended layer and the like are to be formed. Phosphorus (P$^+$) ions are then implanted into the Si epitaxial layer 29 to form an extended layer 18 in the variable capacitor formation region Rvarc. The resultant substrate is then annealed at 950° C. to reduce the resistance of the extended layer 18.

In the step of FIG. 4B, arsenic ions (As$^+$) are implanted into the upper portion of the N$^+$ layer 16 in the variable capacitor formation region Rvarc to form a variable capacitance region 16a. This implantation is conducted at an implantation energy of 30 keV and a dose of $2.8 \times 10^{12}$ atoms·cm$^{-2}$. In order to activate As in the variable capacitance region 16a, an RTA (Rapid Thermal Annealing) process is then conducted at 1,000° C. for 10 sec. An As concentration profile as shown in FIG. 10 is produced by the series of processes. More specifically, the As concentration is gradually reduced from the surface of the substrate toward the inside thereof.

In the step of FIG. 4C, an oxide film with a thickness of about 40 nm and a polysilicon film with a thickness of about 100 nm are formed sequentially. These films are then patterned to form a mask 47 that exposes only the top portion of the variable capacitance region 16a. A P$^+$ layer 21 with a thickness of about 110 nm is then epitaxially grown on the top surface of the variable capacitance region 16a. The P$^+$ layer 21 is formed from a $Si_{0.85}Ge_{0.15}$ film and a Si film. During the epitaxial growth, a part of the P$^+$ layer 21 is in situ doped with boron having a concentration of about $6 \times 10^{18}$ cm$^{-3}$. The P$^+$ layer 21 is thus formed from an undoped $Si_{0.85}Ge_{0.15}$ film with a thickness of 40 nm, a boron-doped $Si_{0.85}Ge_{0.15}$ film with a thickness of 40 nm and an undoped Si film with a thickness of 30 nm.

In the step of FIG. 4D, a polysilicon film 48 with a thickness of 100 nm is deposited on the substrate. Boron is then implanted to reduce the resistance of the polysilicon film 48. This implantation is conducted at an implantation energy of 8 keV and a dose of $1.6 \times 10^{16}$ cm$^{-2}$.

In the step, of FIG. 4E, the polysilicon film 48 is patterned to from a P-type electrode 22 in the variable capacitor formation region Rvarc. The P-type electrode 22 thus formed is in contact with the P$^+$ layer 21. An oxide film on the P-type electrode 22 is then removed by a wet etching process. Thereafter, a titanium film with a thickness of about 40 nm is deposited on the substrate by a sputtering process. An RTA process is then conducted for silicidation. Moreover, the unreacted titanium film on the oxide film is removed with a mixture of sulfuric acid and hydrogen peroxide solution. An RTA process for reducing the resistance is conducted to form a titanium silicide layer in the P-type electrode 22.

Although the following steps are not shown in the figure, the variable capacitor of the semiconductor device shown in FIG. 1 is formed by sequentially conducting the commonly used steps such as the steps of forming an interlayer insulating film, planarizing by a CMP process, forming a contact, and forming an aluminum wiring.

Note that, in the present embodiment, As is implanted into the variable capacitance region 16a at an implantation energy of 30 keV and a dose of $2.8 \times 10^{12}$ atoms·cm$^{-2}$. However, in order to obtain a desired change in capacitance within a variable range of the voltage used in the circuitry, the implantation conditions can be optimized according to the type of variable capacitor and applications thereof.

Moreover, it is preferable to optimize the boron concentration and the composition ratio of Ge in the SiGe layer in order to control a leak current of the PN junction to a desired value. Although the mask 47 includes a polysilicon film in order to suppress abnormal epitaxial growth of SiGe. In the case where the growth method (selective growth or non-selective growth) can be easily controlled, the mask 47 may not include the polysilicon film.

Figure 5A:
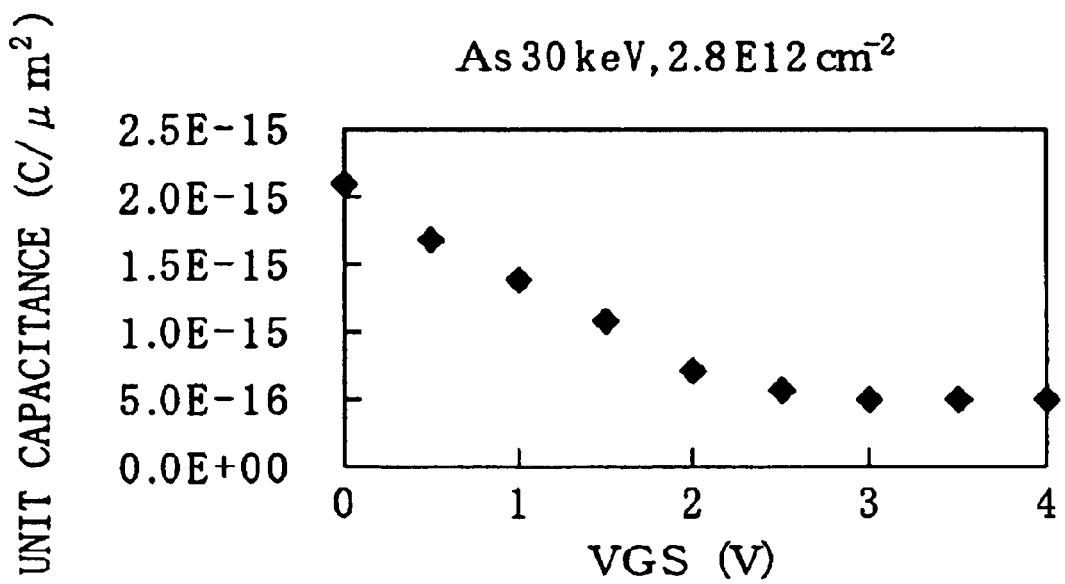
FIGS. 5A and 5B show the voltage dependence of the capacitance of a variable capacitor in a semiconductor device formed according to a method of the present invention for different impurity concentration profiles.
Figure 5B:
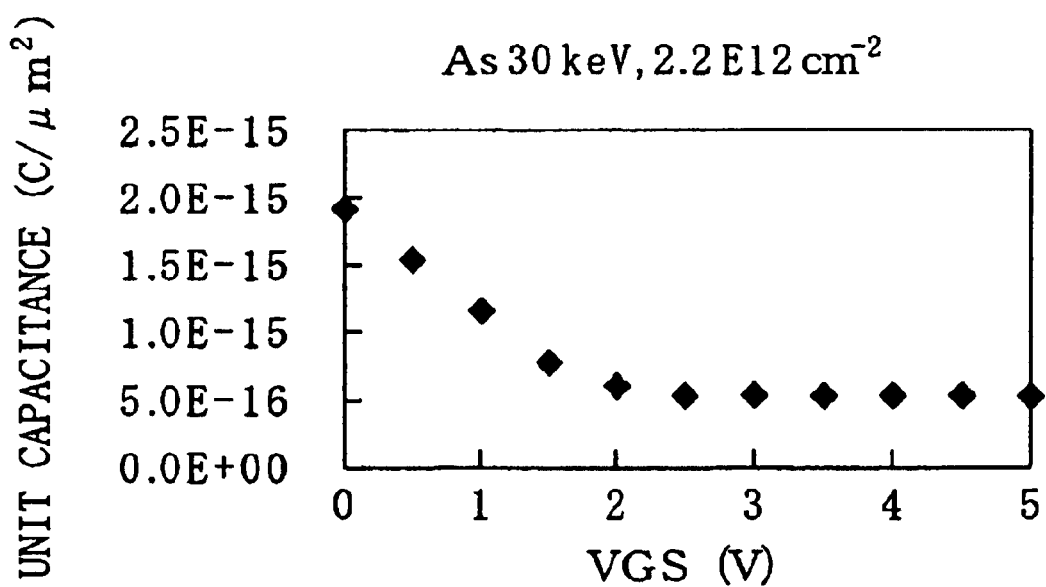

FIGS. 5A and 5B show voltage dependence of the capacitance of the variable capacitor in the semiconductor device formed according to the method of the present invention for different impurity concentration profiles. In FIGS. 5A and 5B, the abscissa indicates an applied voltage to the P-type electrode 22, and the ordinate indicates a unit capacitance ($C/\mu M^2$) of the variable capacitor. The characteristics shown in FIG. 5A correspond to the case where the ion implantation to the variable capacitance region 16a was conducted at an implantation energy of 30 keV and a dose of $2.8 \times 10^{12}$ atoms·cm$^{-2}$. The characteristics shown in FIG. 5B correspond to the case where the ion implantation to the variable capacitance region 16a was conducted at an implantation energy of 30 keV and a dose of $2.2 \times 10^{12}$ atoms·cm$^{-2}$. According to the characteristics of FIG. 5A, a change in capacitance between 1 V and 2 V is about 1.9. According to the characteristics of FIG. 5B, a change in capacitance between 1 V and 2V is about 2.0. It is found from FIGS. 3A and 3B that a rate of change in capacitance between any two voltages can be controlled by changing the dose.

Note that, in the case where the variable capacitor was formed by merely implanting impurities into the Si epitaxial layer 29 (see FIG. 3C) as in the conventional example, a change in capacitance between 1 V and 2 V was about 1.1.

Like the present embodiment, forming the P-type electrode 22 including a polysilicon layer on the P$^+$ layer 21 prevents a contact (tungsten plug 32) from being formed directly on the SiGe film. This suppresses disadvantages such as introduction of defects into the thin SiGe layer and defective short-circuit due to the contact extending through the P$^+$ layer 21.

Note that, in the present embodiment, the P$^+$ layer is mainly formed from a SiGe film. However, even if the P$^+$ layer is formed from an epitaxially grown Si film instead of the SiGe film, the variation range of the capacitance can be increased by the increased range of the depletion layer. It should be noted that forming the P$^+$ layer from a SiGe film enables doping of higher concentration boron. This results in an increased concentration in the P$^+$ layer, enabling further increase in variation range of the capacitance.

(Second Embodiment)

FIG. 6 is a cross-sectional view of a semiconductor device including a variable capacitor (variable capacitance diode) and an NPN-HBT (Hetero-junction Bipolar Transistor) on a common semiconductor substrate according to the second embodiment of the present invention. In the first embodiment, an example of the semiconductor substrate including only a variable capacitor is described. In the second embodiment, as shown in FIG. 6, a variable capacitor VAR is formed on the same semiconductor substrate as that of the NPN-HBT of an oscillation circuit.

A first isolation region 51 and a second isolation region 55 are formed in a silicon substrate 50. The first isolation region 51 is formed by depositing a thin silicon oxide film 53 in a deep trench and then introducing polysilicon 12 into the resultant trench. The second isolation region 55 is formed by introducing a silicon oxide film 53 into a shallow trench. The first isolation region 51 and the second isolation region 55 isolate the variable capacitor VAR and the NPN-HBT from each other. The second isolation region 55 defines an active region in each element.

The variable capacitor VAR includes an N$^+$ layer 56, an extended layer 58, a P$^+$ layer 61, and a P-type electrode 62.

The N+ layer 56 is formed by doping the silicon substrate 50 with arsenic (As), and has a depth of 0.55 μm. The extended layer 58 is formed by doping a surface portion of the N+ layer 56 with high concentration As. The P+ layer 61 is epitaxially grown on the N+ layer 56, and is formed from a SiGe film partially containing boron (B) and a Si film. The P+ layer 61 has a thickness of 110 nm. The P-type electrode 62 is formed from a P+ polysilicon film covering the P+ layer 61 and a titanium silicide layer formed thereon. The P+ layer 61 is formed from an undoped $Si_{0.85}Ge_{0.15}$ film with a thickness of 40 nm, a boron-doped $Si_{0.85}Ge_{0.15}$ film with a thickness of 40 nm, and an undoped Si film with a thickness of 30 nm. The impurity concentration profile in a variable capacitance region 56a, i.e., a region of the N+ layer 56 that is located near the P+ layer 61, is such that the impurity concentration is $1\times10^{18}$ cm$^{-3}$ at the surface and is gradually reduced toward the inside of the substrate. The second isolation region 55 isolates the variable capacitance region 56a and the extended layer 58 from each other.

The NPN-HBT includes a collector diffusion layer 57, an N− collector layer 59, an N+ collector extended layer 60, and a first deposited oxide film 70. The collector diffusion layer 57 is formed simultaneously with the N+ layer 56 of the variable capacitor VAR. The N+ collector layer 59 is a layer doped with relatively low concentration arsenic (As). The N+ collector extended layer 60 is provided for contact with an electrode. The first deposited oxide film 70 has a collector opening 71 and has a thickness of about 30 nm. A Si/SiGe layer 79 is formed on the region of the top surface of the silicon substrate 50 that is exposed by the collector opening 71. The Si/SiGe layer 79 is a lamination of a SiGe layer doped with P-type impurities and having a thickness of about 80 nm and a Si film having a thickness of about 30 nm. The Si/SiGe layer 79, which serves as a base layer, is selectively grown on the region of the top surface of the silicon substrate 50 that is exposed by the collector opening 71. The Si/SiGe layer 79 is formed from an undoped $Si_{0.85}Ge_{0.15}$ film with a thickness of 40 nm, a boron-doped $Si_{0.85}Ge_{0.15}$ film with a thickness of 40 nm, and an undoped Si film with a thickness of 30 nm. The lower part of the central portion of the Si/SiGe layer 79 serves as an internal base. The upper part of the central portion of the Si/SiGe layer 79 (mainly, Si film) serves as an emitter layer. An external base implantation region is formed in the Si/SiGe layer 79 and the surface portion of the collector diffusion layer 57 by implantation of boron ions. As a part of the external base implantation region, a junction leak preventing layer 66 having a concentration of about $3\times10^{17}$ atoms·cm$^{-3}$ is formed in the surface portion of the collector diffusion layer 57.

A second deposited oxide film 72 with a thickness of about 30 nm is formed on the Si/SiGe layer 79 and the first deposited oxide film 70. The second deposited oxide film 72 serves as an etch stopper. A base junction opening 74 and a base opening 78 are formed in the second deposited oxide film 72. A P+ polysilicon layer 75 having a thickness of about 150 nm and a third deposited oxide film 77 are formed in the base junction opening 74 and extend over the second deposited oxide film 72. The Si/SiGe layer 79 excluding the region located under the base opening 78 and the P+ polysilicon layer 75 form an external base.

The P+ polysilicon layer 75 and the third deposited oxide film 77 have an opening at a position corresponding to the base opening 78 of the second deposited oxide film 72. A fourth deposited oxide film 80 with a thickness of about 30 nm is formed on the side surface of the P+ polysilicon layer 75. A polysilicon sidewall 81 with a thickness of about 100 nm is formed on the fourth deposited oxide film 80. An N+ polysilicon layer 82 fills the base opening 78 and extends over the third deposited oxide film 77. The N+ polysilicon layer 82 serves as an emitter extended electrode. The fourth deposited oxide film 80 electrically insulates the P+ polysilicon layer 75 and the N+ polysilicon layer 82 from each other. The third deposited oxide film 77 insulates the top surface of the P+ polysilicon layer 75 and the N+ polysilicon layer 82 from each other.

A titanium silicide layer is formed on the P+ polysilicon layer 75 and the N+ polysilicon layer 82.

An interlayer insulating film 65 covers the substrate. A barrier film 63 and a tungsten plug 64 that extend through the interlayer insulating film 65 are connected to a portion 62, 58, 60, 82, 75. A wiring is formed form an aluminum (Al) alloy film 67 and an anti-reflection film 68 formed thereon. Note that the barrier film 63 extends also between the interlayer insulating film 65 and the Al alloy film 67.

In the present embodiment as well, the impurity concentration profile in the N+ layer 61 of the variable capacitor VAR is basically the same as that of the first embodiment as shown in FIG. 10. In other words, the impurity concentration is the highest at the surface of the silicon substrate 50 and is gradually reduced toward the inside of the silicon substrate 50. The impurity concentration profile in the collector layer 59 and the collector diffusion layer 57 of the NPN-HBT is such that the impurity concentration is relatively low at the surface of the silicon substrate 50 and is gradually increased toward the inside of the silicon substrate 50.

Figure 7:
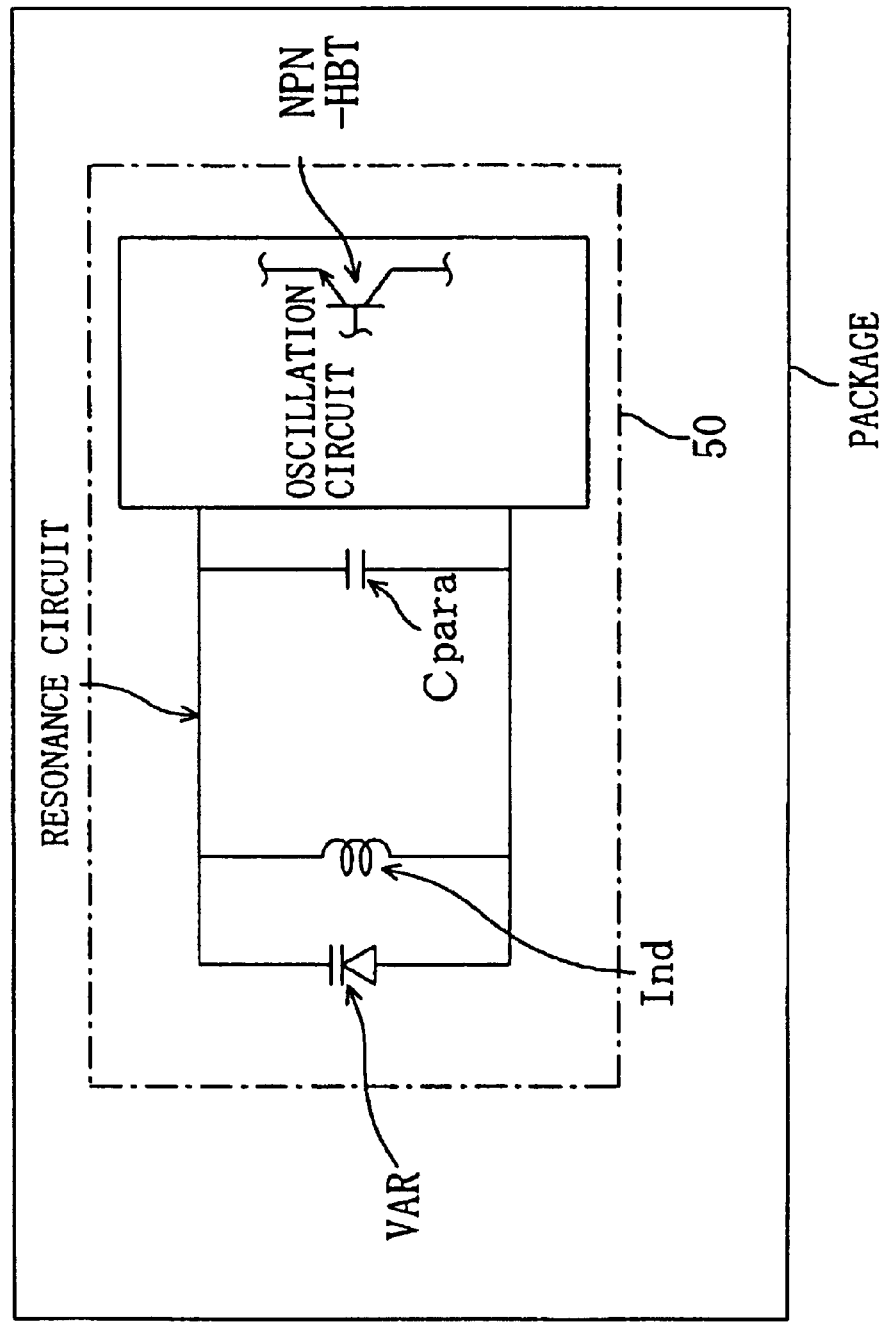
FIG. 7 is a block diagram of the circuit structure of a main part of the semiconductor device according to the second embodiment.

FIG. 7 is a block diagram showing the circuit structure of a main part of the semiconductor device according to the present embodiment. AS shown in FIG. 7, an oscillation circuit including an NPN-HBT, a variable capacitor VAR and a resonance inductor Ind are provided on the silicon substrate 50. The silicon substrate 50 including these elements is mounted within a single package. The oscillation circuit, the variable capacitor VAR and the resonance inductor Ind form a resonance circuit. The NPN-HBT and the variable capacitor VAR have the same structure as that shown in FIG. 6. Although the structure of the resonance inductor Ind is not shown in the figure, the resonance inductor Ind is formed from, e.g., a conductor film patterned into a swirl shape. The parasitic capacitance Cpara of a PAD is present between the oscillation circuit and the variable capacitor VAR.

Note that a circuit other than the resonance circuit such as a logic circuit including a MIS transistor may be provided on the silicon substrate 50.

Figure 9:
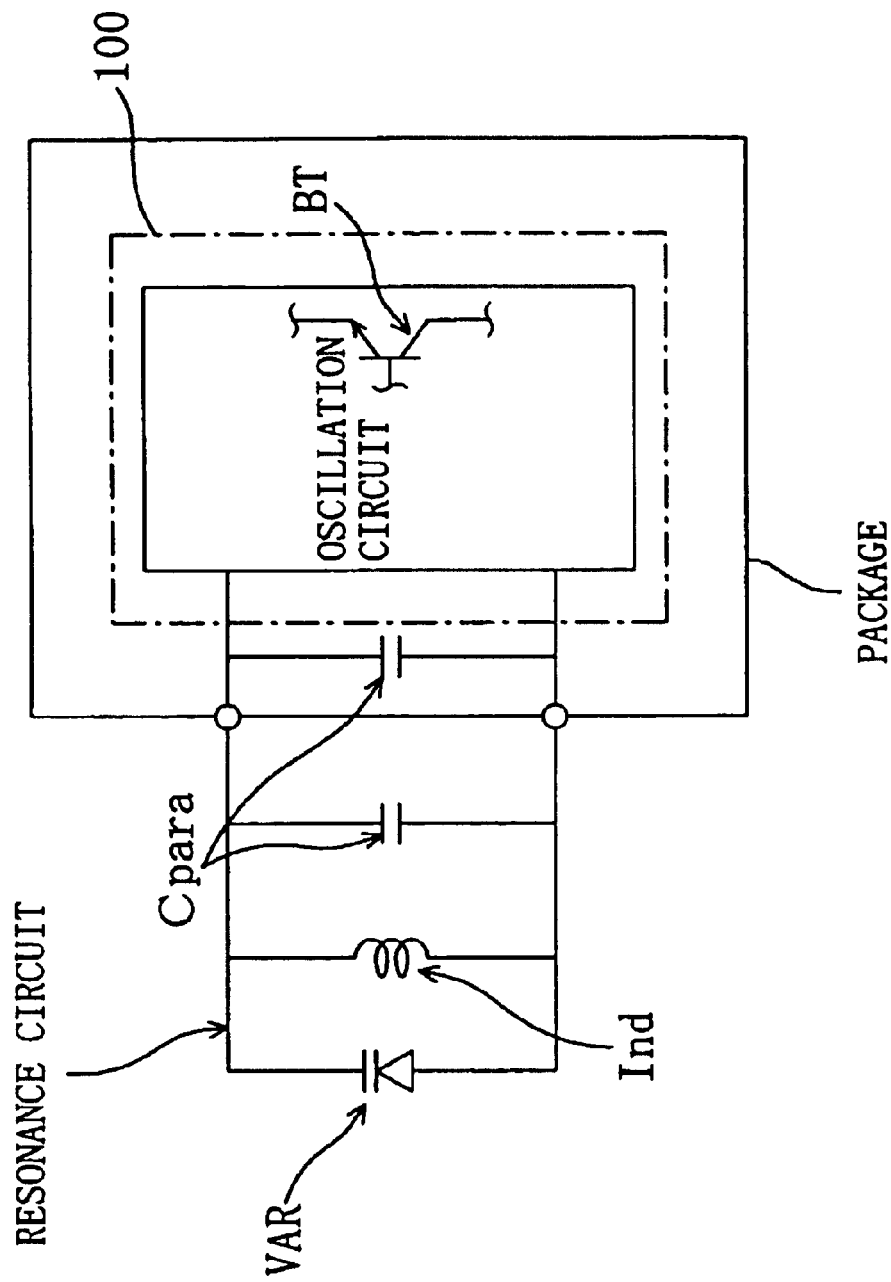

According to the semiconductor device of the present embodiment, the variable capacitor VAR and the oscillation circuit (bipolar transistor) are provided on the same semiconductor substrate. As a result, the following effects are obtained: unlike the conventional semiconductor device of FIG. 9, a parasitic capacitance Cpara is present only around the PAD in the semiconductor device of the present embodiment. This inhibits the variation range of the oscillation frequency from being reduced by the parasitic capacitance. In other words, reducing the capacitance of the variable capacitor VAR enables the resonance frequency of the resonance circuit to be increased, making it possible to deal with a higher frequency. Accordingly, the variation range of the capacitance of the variable capacitance diode, i.e., the variable capacitor, can be reduced, whereby the burden on the device design is reduced.

In the case where the variable capacitor and the NPN-HBT are formed on the common silicon substrate 50, the depth of the collector diffusion layer 57 must be reduced for a higher frequency. As a result, the depth of the N⁺ layer 56 formed simultaneously with the collector diffusion layer 57 must be reduced accordingly. This reduces the range of the depletion layer formed between the P⁺ layer 61 and the N⁺ layer 56 of the variable capacitor VAR.

According to the semiconductor device of the present embodiment, however, a PN junction is formed between an epitaxial layer and an underlying silicon layer, i.e., between the P⁺ layer 61 and the N⁺ layer 56 (especially, variable capacitance region 56a). Therefore, the range of the depletion layer can be increased according to application of a voltage. In other words, the variable capacitor VAR and the NPN-HBT can be formed on the same semiconductor substrate while maintaining proper variation characteristics of the capacitance of the variable capacitor VAR (variable capacitance diode) according to an increase in frequency of the NPN-HBT. In particular, the capacitance of the variable capacitor is reduced as the range of the depletion layer is increased, making it possible to deal with a higher frequency.

Moreover, improvement in capability of the variable capacitor enables reduction in the number of variable capacitors required for a certain device. In other words, the number of variable capacitors to be formed on a single semiconductor substrate can be reduced. This enables improvement in integration of the semiconductor device.

Note that the resonance inductor need not necessarily be formed on the same semiconductor substrate as that of the oscillation circuit (NPN-HBT) and the variable capacitor VAR. For example, the resonance inductor may be formed on the motherboard. In this case as well, the above effects of the present embodiment can be obtained.

FIGS. 8A to 8E are cross-sectional views illustrating a manufacturing process of the semiconductor device according to the second embodiment of the present invention.

The steps corresponding to FIGS. 3A to 4B of the first embodiment are completed before the step of FIG. BA. Accordingly, the first isolation region 51 and the second isolation region 52 have been formed in the silicon substrate 50. Moreover, in the variable capacitor formation region Rvarc, the N⁺ layer 56 has been formed by doping the silicon substrate 50 with arsenic (As) and the extended layer 58 has been formed by doping the surface portion of the N⁺ layer 56 with high concentration As. In a region Rhbt where an HBT is to be formed (hereinafter, referred to as HBT formation region Rhbt), the collector diffusion layer 57 has been formed simultaneously with the N⁺ layer 56 of the variable capacitor VAR, and the N⁻ collector layer 59 containing relatively low concentration As and the N⁺ collector extended layer 60 for contact with an electrode have been formed.

Figure 8:
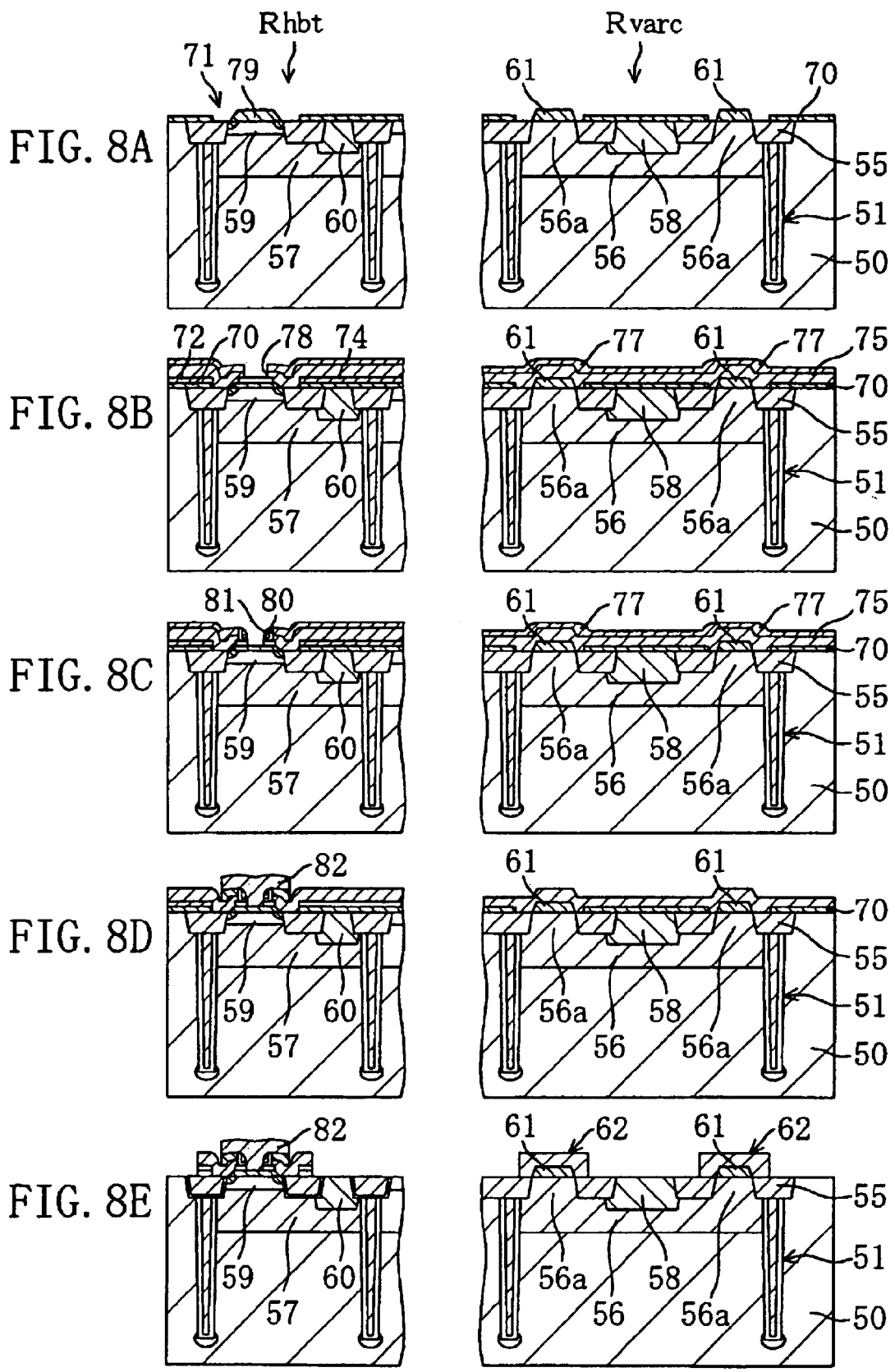
FIGS. 8A to 8E are cross-sectional views illustrating a manufacturing process of the semiconductor device according to the second embodiment.

In the step of FIG. 8A, a first deposited oxide film 70 with a thickness of 30 nm is formed on the substrate. The first deposited oxide film 70 is then patterned to form an opening in the upper portion of the variable capacitance region 56a in the variable capacitor formation region Rvarc and a collector opening 71 in the HBT formation region Rhbt. A P⁺ layer 61 and a Si/SiGe layer 79 are epitaxially grown on the top surface of the variable capacitance region 56a and the collector layer 59, respectively. Each of the P⁺ layer 61 and the Si/SiGe layer 79 is formed from a Si$_{0.85}$Ge$_{0.15}$ film and a Si film, and has a thickness of about 110 nm. During the epitaxial growth, a part of the P⁺ layer 61 and a part of the Si/SiGe layer 79 are in-situ doped with boron having a concentration of about 6×10$^{18}$ cm$^{-3}$. Each of the P⁺ layer 61 and the Si/SiGe layer 79 is thus formed from an undoped Si$_{0.85}$Ge$_{0.15}$ film with a thickness of 40 nm, a boron-doped Si$_{0.85}$Ge$_{0.15}$ film with a thickness of 40 nm and an undoped Si film with a thickness of 30 nm.

In the step of FIG. 8B, a second deposited oxide film 72 with a thickness of 30 nm is formed on the substrate as an etch stopper. The second deposited oxide film 72 is then patterned by a dry etching process to form a base junction opening 74. The central portion of the Si/SiGe layer 79 is covered with the second deposited oxide film 72, and the base junction opening 74 exposes the peripheral portion of the Si/SiGe layer 79 and a part of the first deposited oxide film 70.

By using the resist mask used to form the base junction opening 74, P-type impurity ions such as boron (B) are implanted to form an external base implantation region in the Si/SiGe layer 79 and the surface portion of the collector diffusion layer 57. As a part of the external base implantation region, a junction leak preventing layer 66 having a concentration of about 3×10$^{17}$ atoms·cm$^{-3}$ is formed in the surface portion of the collector diffusion layer 57.

By a CVD (Chemical Vapor Deposition) process, a highly doped (1×10$^{20}$ atoms·cm$^{-3}$ or more) P⁺ polysilicon layer 75 with a thickness of about 150 nm and a third deposited oxide film 77 with a thickness of about 100 nm are sequentially formed on the substrate. The third deposited oxide film 77 and the P⁺ polysilicon layer 75 are then patterned by a dry etching process to form a base opening 78 in the central portion of the third deposited oxide film 77 and the P⁺ polysilicon layer 75 in the HBT formation region Rhbt. The base opening 78 reaches the second deposited oxide film 72. The base opening 78 is smaller than the central portion of the second deposited oxide film 72. Therefore, the base opening 78 will not extend entirely across the base junction opening 74. In this step, an external base is formed from the P+ polysilicon layer 75 and the Si/SiGe layer 79 excluding its central portion.

In the step of FIG. 8C, a deposited oxide film with a thickness of about 30 nm and a polysilicon film with a thickness of about 150 nm are formed on the whole surface of the wafer by a CVD process. The deposited oxide film and the polysilicon film are then etched back by an anisotropic dry etching process to form a polysilicon sidewall 81. More specifically, the polysilicon sidewall 81 is formed on the respective side surfaces of the P+ polysilicon layer 75 and the third deposited oxide film 77 with a fourth deposited oxide film 80 interposed therebetween. Thereafter, a wet etching process is conducted using hydrofluoric acid or the like to remove the exposed portion of the second deposited oxide film 72 and the fourth deposited oxide film 80. As a result, the upper portion of the Si/SiGe layer 79, i.e., the Si layer, is exposed in the base opening 78.

In the step of FIG. 8D, an N⁺ polysilicon film with a thickness of about 250 nm is deposited. The N⁺ polysilicon film is then patterned by a dry etching process to form an N⁺ polysilicon layer 82 in the HBT formation region Rhbt an emitter extended electrode. In this step, the outer portion of the P⁺ polysilicon layer 75 is not patterned.

In the step of FIG. 8E, the third deposited oxide film 77, the P⁺ polysilicon layer 75, the second deposited oxide film 72 and the first deposited oxide film 70 are patterned by a dry etching process. This step is conducted to determine the shape of the external base in the HBT formation region Rhbt and to form a P-type electrode 62 in the variable capacitor formation region Rvarc.

Although the following steps are not shown in the figure, the semiconductor device shown in FIG. 6 is formed by sequentially conducting the steps of forming a titanium silicide layer, forming an interlayer insulating film, planarizing by a CMP process, forming a contact, forming an aluminum wiring, and the like.

As has been described above, according to the manufacturing method of the present embodiment, the variable capacitor VAR having a large variation range of a capacitance and the NPN-HBT can be formed on the common semiconductor substrate while forming the variable capacitor VAR and the NPN-HBT in as many common steps as possible.

Note that the P$^+$ layer formed from an epitaxial layer and the P$^+$ polysilicon film are required for the variable capacitor. Since the SiGe base layer and the P$^+$ polysilicon film serving as an external base are formed in the NPN-HBT, the NPN-HBT and the variable capacitor can be formed on the same substrate by using the process of the NPN-HBT.

In the present embodiment, the P$^+$ layer 61 of the variable capacitor VAR is mainly formed from a SiGe film. Accordingly, like the first embodiment, the variation range of the capacitance can be increased by an increased concentration in the P$^+$ layer.

According to the manufacturing method of the present embodiment, the P$^+$ layer 61 of the variable capacitor VAR and the Si/SiGe layer 79 serving as a base layer of the NPN-HBT are formed from a common epitaxial layer. Moreover, the P-type electrode 62 of the variable capacitor VAR and the P$^+$ polysilicon layer 75 serving as an external base of the NPN-HBT are formed from a common polysilicon film. This reduces the number of steps and stabilizes the device characteristics.

Note that the SiGe film in the P$^+$ layer 21, 61 of the first and second embodiments may be replaced with a SiGeC film.

Moreover, the SiGe layer, which is the P$^+$ layer of the variable capacitor VAR and the base layer of the NPN-HBT, may be replaced with a Si film. However, the use of the SiGe layer enables implementation of a higher frequency of the NPN-HBT as compared to the Si film. Note that the SiGe film or the SiGeC film may be a film having a composition gradient. In this case, a higher base running speed can be obtained in the HBT.

What is claimed is:

1. A method for manufacturing a semiconductor device including a variable capacitor and a bipolar transistor on a common semiconductor substrate, comprising the steps of:

(a) forming a first semiconductor layer of a first conductivity type on a surface of the semiconductor substrate in a region where the variable capacitor is to be formed, and forming a collector layer of a first conductivity type on the surface of the semiconductor substrate in a region where the bipolar transistor is to be formed;

(b) after the clap (a), forming a second semiconductor layer of a second conductivity type on the first semiconductor layer in a region where the variable capacitor is to be formed by an epitaxial grown method so as to project from the surface of the semiconductor substrate, and forming a base layer of a second conductivity type on the collector layer in a region where the bipolar transistor is to be formed by an epitaxial grown method so as to project from the surface of the semiconductor substrate, and (c) forming an emitter layer on the base layer.

2. The method according to claim 1, between the step (a) and (b), further comprising a step or diffusing the impurity concentration of the first conductivity type in the fist semiconductor layer by heating the semiconductor substrate so as to be gradually reduced from the surface of the semiconductor substrate toward the inside thereof.

3. The method according to claim 1, wherein the first semiconductor layer is a Si layer, and the second semiconductor layer is a SiGo or SiGeC layer.

4. The method according to claim 1, wherein the conductive layer is Si layer, and the base layer is a SiGe or SiGeC layer.

5. The method according to claim 1, further including an oscillation circuit, wherein the variable capacitor is connected to the forming an oscillation circuit.

* * * * *